United States Patent
Hayakawa et al.

(10) Patent No.: US 6,625,190 B1
(45) Date of Patent: Sep. 23, 2003

(54) SEMICONDUCTOR LASER DEVICE HAVING THICKENED IMPURITY-DOPED ALUMINUM-FREE OPTICAL WAVEGUIDE LAYERS

(75) Inventors: Toshiro Hayakawa, Kaisei-machi (JP); Toshiaki Fukunaga, Kaisei-machi (JP); Mitsugu Wada, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/648,807

(22) Filed: Aug. 28, 2000

(30) Foreign Application Priority Data

Aug. 26, 1999 (JP) ............................ 11/239119

(51) Int. Cl.[7] ............................................ H01S 3/19
(52) U.S. Cl. ........................................ 372/45; 372/49
(58) Field of Search ................. 372/43, 45, 46; 438/46, 31

(56) References Cited

U.S. PATENT DOCUMENTS

| | | | | |
|---|---|---|---|---|
| 4,546,480 A | * | 10/1985 | Burnham et al. | 372/45 |
| 4,602,371 A | * | 7/1986 | Kawano et al. | 372/45 |
| 4,731,789 A | * | 3/1988 | Thornton | 372/45 |
| 5,212,704 A | * | 5/1993 | Chen et al. | 372/46 |
| 5,742,629 A | * | 4/1998 | Nishikawa et al. | 372/46 |
| 5,818,860 A | | 10/1998 | Garbuzov et al. | 372/45 |
| 5,889,805 A | * | 3/1999 | Botez et al. | 372/45 |
| 6,008,067 A | * | 12/1999 | Ramdani et al. | 372/43 |
| 6,172,382 B1 | * | 1/2001 | Nagahama et al. | 257/94 |
| 6,356,572 B1 | * | 3/2002 | Tanaka et al. | 372/45 |

FOREIGN PATENT DOCUMENTS

TW            352482        *   8/1997   ............. H01S/3/18

OTHER PUBLICATIONS

Fukunaga, Toshiaki et al, Highly Reliable Operation of HIgh–Power InGaAsP/AlGaAs 0.8 μm Separate Confinement Heterostructure Lasers, Jpn. J. Appl. Phys. vol. 34 (1995) pp. L 1175–L1177.

O'Brien, S. et al, High power wide aperture AlGaAs–based lasers at 870 nm, ELECTRONICS LETTERS, Jan. 22, 1998, vol. 34, No. 2, pp. 184–186.

* cited by examiner

Primary Examiner—Paul Ip
Assistant Examiner—Dung Nguyen
(74) Attorney, Agent, or Firm—Sughrue Mion, PLLC

(57) ABSTRACT

In a semiconductor laser device including an active region which is made of an aluminum-free material and a plurality of cladding layers made of at least one AlGaAs or AlGaInP material, the active region includes a quantum well layer and at least one optical waveguide layer; a portion of the at least one optical waveguide layer located on one side of the quantum well layer has a thickness of 0.25 μm or more; and the at least one optical waveguide layer, other than a portion of the at least one optical waveguide layer being located near the quantum well layer and having a thickness of at least 10 nm, is doped with impurity of $10^{17}$ cm$^{-3}$ or more.

6 Claims, 7 Drawing Sheets

SEMICONDUCTOR LASER DEVICE HAVING THICKENED IMPURITY-DOPED ALUMINUM-FREE OPTICAL WAVEGUIDE LAYERS

BACKGROUND OF THE INVENTION

1. Field of the Invention

The present invention relates to a semiconductor laser device having an active region made of at least one aluminum-free material.

2. Description of the Related Art

Recently, the range of uses of semiconductor laser devices is extending remarkably. In particular, the range of uses of the semiconductor laser devices using a GaAs substrate and emitting laser light in the 0.7 to 1.1 µm wavelength band is extending with increase in their output power. For example, such semiconductor laser devices are currently used as: excitation light sources in solid-state lasers, optical fiber amplifiers, and fiber lasers; primary light sources for second harmonic generation; light sources for laser thermal image formation on thermally-sensitive materials in the field of printing; and light sources in laser beam machining, soldering, and medical applications.

In the above applications, it is very important to increase output power of the semiconductor laser devices. As examples of narrow-stripe single-mode semiconductor laser devices having a stripe width of about 5 µm or less, semiconductor laser devices which emit laser light of 0.98 and 1.02 µm wavelengths, have a maximum optical output power of 500 mW or more and a practical optical output power of 150 mW or more, and are used as excitation light sources for optical fiber amplifiers, are reported. In addition, as examples of wide-stripe multiple-mode semiconductor laser devices having a stripe width of about 50 µm or more, a semiconductor laser device which has a stripe width of 100 µm and a maximum breakdown optical output of 11.3 W at the oscillation wavelength of 0.87 µm, and a semiconductor laser device having a stripe width of 200 µm and a maximum breakdown optical output of 16.5 W at the oscillation wavelength of 0.87 µm are reported. (Refer to S. O'brien, H. Zhao, and R. J. Lang, Electronics Letters, vol. 34, No. 2, pp.184, 1998.)

Previously, the present applicants proposed a semiconductor laser device which achieves high output power by making a light emission region and its vicinity aluminum-free so as to prevent sudden failure due to oxidation of aluminum, and forming cladding layers with AlGaAs so as to prevent deterioration of temperature characteristics due to leakage of electrons from the active region. (Refer to T. Fukunaga, M. Wada, H. Asano, and T. Hayakawa, Japanese Journal of Applied Physics, vol. 34, No. 9B, pp.L1175, 1995.)

In the above semiconductor laser device proposed by the present applicants, an InGaP cladding layer having a thickness of 0.1 µm is provided on each side of a quantum well layer (i.e., a total thickness on both sides is 0.2 µm), and a laser light confinement factor Γ is relatively large. Therefore, when a semiconductor laser device having a stripe width of 50 µm is aged at 50° C. with a power of 500 mW in an automatic power control (APC) mode, the applicants obtained a median deterioration rate of $5\times10^{-5}$ h$^{-1}$, which is represented by the rate of increase in the driving current in the APC mode. In addition, when a semiconductor laser device having a stripe width of 200 µm is aged with power of 200 mW in an automatic power control (APC) mode at 25° C., the applicants also obtained a median deterioration rate of $5\times10^{-5}$ h$^{-1}$, which is represented by the rate of increase in the driving current in the APC mode. That is, the deterioration rate is relatively high. Since the high-output-power semiconductor laser devices having wide stripe structure stop oscillation when the driving current increases by about 5%, for example, the median value of the lifetime of the above semiconductor laser device having a stripe width of 200 µm is estimated at about 1,000 hours, which is practically insufficient.

SUMMARY OF THE INVENTION

An object of the present invention is to provide a high-output-power semiconductor laser device, containing an Al-free active layer, which has a longer lifetime and higher long-term reliability than the conventional semiconductor laser devices containing an Al-free active layer.

According to the present invention, there is provided a semiconductor laser device including an active region which is made of an aluminum-free material and a plurality of cladding layers made of at least one AlGaAs or AlGaInP material. The active region includes a quantum well layer and at least one optical waveguide layer; a portion of the at least one optical waveguide layer located on one side of the quantum well layer has a thickness of 0.25 µm or more; and the at least one optical waveguide layer, other than a portion of the at least one optical waveguide layer being located near the quantum well layer and having a thickness of at least 10 nm, is doped with impurity of $10^{17}$ cm$^{-3}$ or more.

Preferably, the semiconductor laser device according to the present invention may also have one or any possible combination of the following additional features (i) and (ii).

(i) Predetermined areas of at least one of said plurality of cladding layers, above a boundary between said at least one of said plurality of cladding layers and one of said at least one optical waveguide layer located below the at least one of said plurality of cladding layers, may be selectively removed so as to form a ridge structure.

(ii) The aluminum-free material may have a composition of $In_xGa_{1-x}As_yP_{1-y}$ ($0 \leq x \leq 1$, $0 \leq y \leq 1$).

Since the thickness of the optical waveguide layer on at least one side is made 0.25 µm or more according to the present invention, the optical density (Γ/d; d is the thickness of the quantum well layer) in the quantum well portion is reduced. Since the deterioration rate (i.e., the rate of increase in the driving current in the APC mode) generally increases in proportion to the fourth power or more of the optical density, both the internal loss and the deterioration rate during APC aging can be reduced in the semiconductor laser device according to the present invention.

In addition, since the at least one optical waveguide layer, other than a portion of the optical waveguide layer being located near the quantum well layer and having a thickness of at least 10 nm, is doped with impurities (donors or acceptors) of $10^{17}$ cm$^{-3}$ or more, the resistance of the optical waveguide layer is reduced.

In addition to the above provision, the active region is made of an aluminum-free material. Therefore, the lifetime of the semiconductor laser device according to the present invention is remarkably increased, and the long-term reliability is also increased.

In particular, the semiconductor laser device according to the present invention realizes high quality index-guided semiconductor laser device, and there is little quality deterioration due to aging. Therefore, the semiconductor laser device according to the present invention can increase reliability of a system which handles images when the semiconductor laser device according to the present invention is used as a light source in the system, since variations in noise, intensity, and beam shapes of the light source are serious matters in such a system which handles images.

Typical examples of applications of the semiconductor laser devices as light sources are printers and image scanners in which visible or ultraviolet light sources are each constituted by a semiconductor laser device and a second harmonic generator. For example, in thermal printing systems using thermal sensitive material and being used in the fields of medicine and printing, semiconductor laser devices per se or semiconductor laser devices coupled with optical fibers are used as light sources for direct exposure in thermal printing. In such thermal printing systems, a few to a hundred high-output-power semiconductor laser devices are used in each system. Therefore, the long-term reliability of the semiconductor laser device according to the present invention can greatly increase reliability of the thermal printing systems.

Conventionally, waveguide loss of laser light in a semiconductor laser device was considered to increase due to free-carrier absorption by the remaining carriers. Therefore, conventionally, the carrier densities in thickened optical waveguide layers were minimized, and no special doping was performed, for example, as disclosed in U.S. Pat. No. 5,818,860. That is, the doping of thickened optical waveguide layers with impurities of $10^{17}$ cm$^{-3}$ or more has not been proposed before the present invention.

Further, the semiconductor laser device according to the present invention has an index-guided structure, where the cladding layers are made of AlGaAs or AlGaInP, and the optical waveguide layer is made of an aluminum-free material such as InGaAsP. Therefore, it is possible to etch one of the cladding layers to the boundary between the cladding layer and the optical waveguide layer due to the difference in the etching rate between the cladding layer and the optical waveguide layer.

In the above construction, a portion of the optical waveguide layer is in contact with an insulation film or a current confinement layer or a regrowth boundary surface. Therefore, there is a possibility of deterioration of the semiconductor laser device due to nonradiative recombination at such a boundary surface. Nevertheless, when the optical waveguide layer is doped according to the present invention, the density of injected minority carriers decreases, and the lifetime of the semiconductor laser device is increased.

Furthermore, according to the present invention, the optical waveguide layer is further thickened, compared with the conventional semiconductor laser device. Accordingly, the penetrated amount of evanescent light into the cladding layer is reduced. Therefore, absorption in the cap layer can be reduced even when the thickness of the upper cladding layer is decreased. That is, the thickness of the upper cladding layer can be 1 µm or less, while the conventional upper cladding layers must have thicknesses of 1.5 µm or more. When the upper cladding layer is made thin, unevenness caused by etching for producing the index-guided structure can be reduced. Therefore, a lithography process becomes easier, and accuracy of the lithography is increased. Thus, since unevenness of the surface of each complete semiconductor laser device can also be reduced, soldering material can be uniformly laid at the time of chip bonding. Therefore, the heat dissipation characteristic of the semiconductor laser device is also improved.

DESCRIPTION OF PREFERRED EMBODIMENTS

Embodiments of the present invention are explained in detail below with reference to drawings.

FIRST EMBODIMENT

Figure 1:
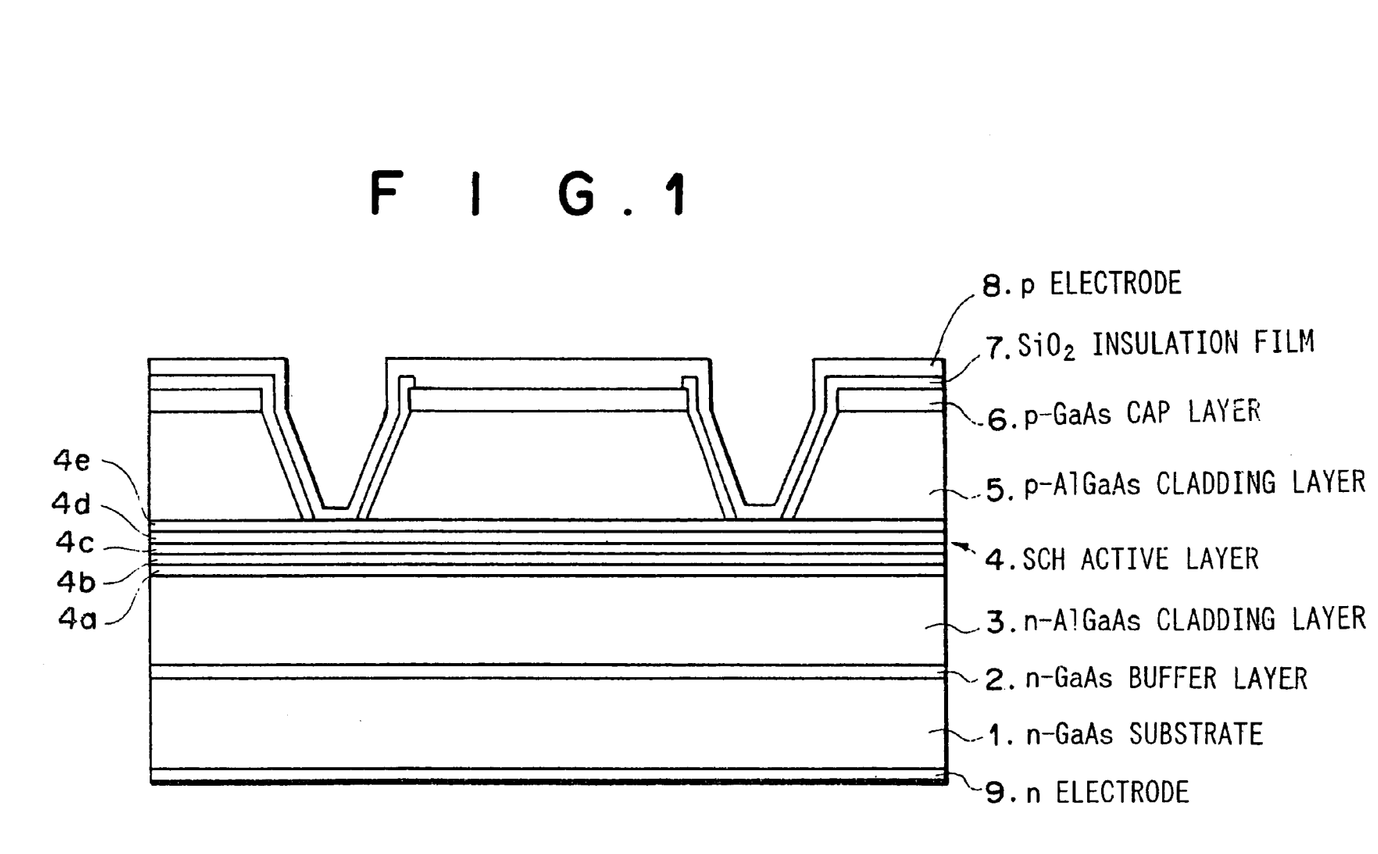
FIG. 1 is a cross-sectional view of a semiconductor laser device as the first embodiment of the present invention.

FIG. 1 is a cross-sectional view of a semiconductor laser device as the first embodiment of the present invention.

As illustrated in FIG. 1, an n-type GaAs buffer layer 2 being doped with $5\times10^{17}$ cm$^{-3}$ Si and having a thickness of 0.5 µm, an n-type Al$_{0.63}$Ga$_{0.37}$As cladding layer 3 being doped with $5\times10^{17}$ cm$^{-3}$ Si and having a thickness of 1 µm, an undoped SCH (separate confinement heterostructure) active layer 4, a p-type Al$_{0.63}$Ga$_{0.37}$As cladding layer 5 being doped with $7\times10^{17}$ cm$^{-3}$ Zn and having a thickness of 1 µm, a p-type GaAs cap layer 6 being doped with $2\times10^{19}$ cm$^{-3}$ Zn and having a thickness of 0.3 µm, and a SiO$_2$ insulation film 7 are formed on an n-type GaAs substrate 1 which is doped with $2\times10^{18}$ cm$^{-3}$ Si.

The undoped SCH active layer 4 is formed of an n-type In$_{0.48}$Ga$_{0.52}$P optical waveguide layer 4a being doped with $5\times10^{17}$ cm$^{-3}$ Si and having a thickness of 0.3 µm, an undoped In$_{0.48}$Ga$_{0.52}$P optical waveguide layer 4b having a thickness of 0.1 µm, an undoped In$_{0.13}$Ga$_{0.87}$As$_{0.75}$P$_{0.25}$ quantum well layer 4c having a thickness of 10 nm, an undoped In$_{0.48}$Ga$_{0.52}$P optical waveguide layer 4d having a thickness of 0.1 µm, and a p-type In$_{0.48}$Ga$_{0.52}$P optical waveguide layer 4e being doped with $7\times10^{17}$ cm$^{-3}$ Zn and having a thickness of 0.3 µm.

In this example, the total thickness Wg of the optical waveguide layers on one side of the quantum well active layer 4c corresponds to the aforementioned thickness of the portion of the at least one optical waveguide layer located on one side of the quantum well layer. That is, Wg=0.3 µm+0.1 µm=0.4 µm.

A process for producing the semiconductor laser device of FIG. 1 is explained below.

First, the n-type GaAs buffer layer 2, the n-type Al$_{0.63}$Ga$_{0.37}$As cladding layer 3, the undoped SCH active layer 4, the p-type $Al_{0.63}Ga_{0.37}As$ cladding layer 5, and the p-type GaAs cap layer 6 are formed in this order on the n-type GaAs substrate 1 by low pressure MOCVD (metal organic chemical vapor development).

Next, a ridge stripe structure having a width of 220 μm at its bottom is formed by photolithography and chemical etching using a mixed solution of $H_2SO_4:H_2O_2:H_2O=$ 20:1:1. In this case, the etching rate of the $Al_{0.63}Ga_{0.37}As$ cladding layer 5 is twenty times the etching rate of the optical waveguide layer 4e. Therefore, the mesa etching can be stopped just above the optical waveguide layer 4e with high repeatability.

Thereafter, the $SiO_2$ insulation film 7 is formed by plasma CVD, and then a portion of the $SiO_2$ insulation film 7 on the top surface of the mesa, except for both edge portions of the mesa with widths of 1 to 5 μm, is removed by using photolithography and diluted HF.

Next, a p (Ti/Pt/Ti/Pt/Au) electrode 8 is formed by evaporation and heat treatment, and the bottom surface of the n-type GaAs substrate 1 is polished so as to reduce the thickness of the n-type GaAs substrate 1 to 100 to 150 μm. Finally, an n (AuGe/Ni/Au) electrode 9 is formed by evaporation and heat treatment.

A laser bar having a length of about 1 cm and a resonator length of 1.5 mm is cut out from the wafer formed as above by scribing with a diamond needle and cleaving, and optical coatings are provided on the optical exit surface and the opposite surface so that the optical exit surface has a reflectance of 20%, and the opposite surface has a reflectance of 95%. Then, discrete laser chips are cut out by scribing with a diamond needle and cleaving. Finally, the p electrode side of the laser chip is bonded to a copper block with indium solder having a thickness of 4 to 5 μm.

At room temperature, the semiconductor laser device produced as above can emit laser light having a wavelength of about 809 nm, above a threshold current of 660 to 700 mA, and a high-output-power operation having output power of 4 W or more is realized.

The advantages of the semiconductor laser device due to the characteristic construction of the present invention are explained below based on the experiment results as illustrated in FIGS. 2 to 5.

Figure 2:
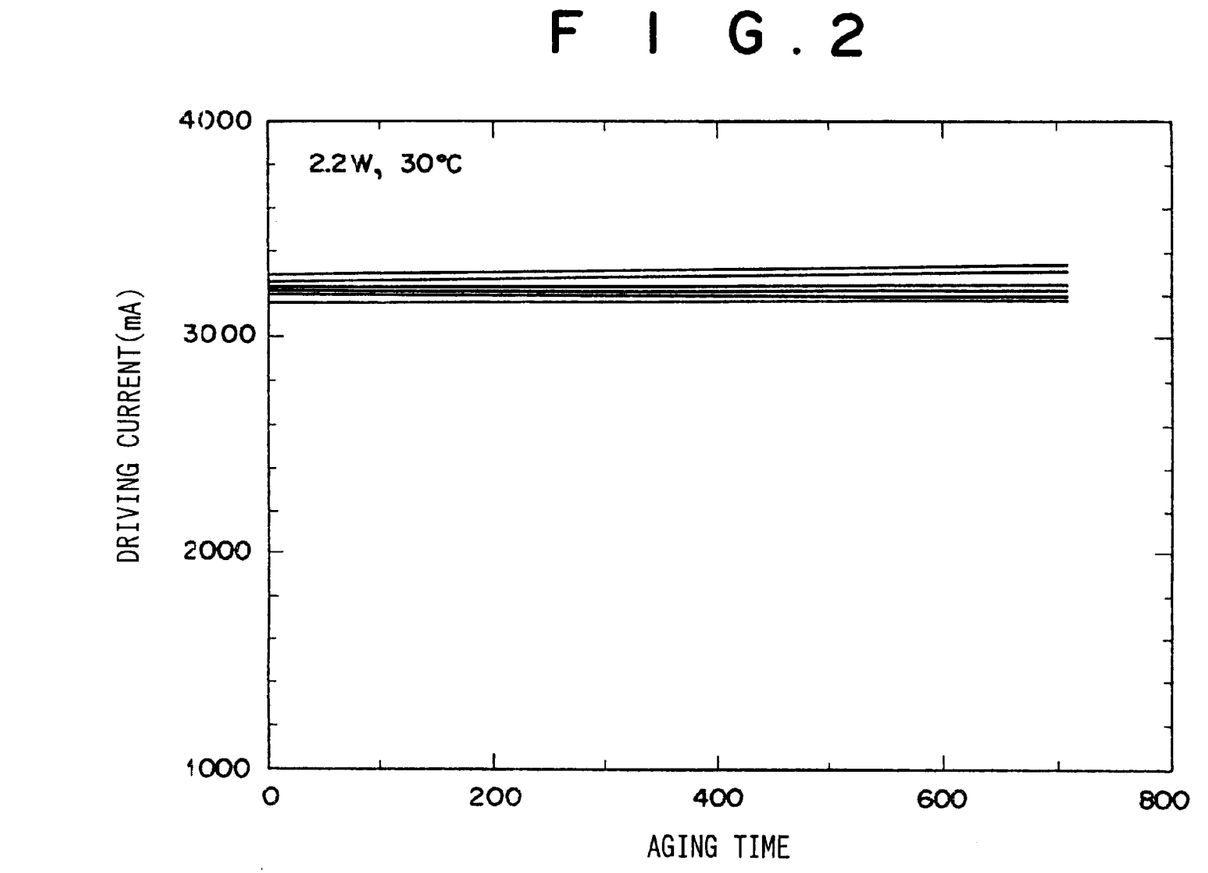
FIG. 2 is a graph indicating variation of the driving current of the ridge waveguide semiconductor laser device as the first embodiment in an APC operation, due to aging.

FIG. 2 is a graph indicating variation of the driving current of the ridge waveguide semiconductor laser device as the first embodiment in an APC operation, due to aging. In the example of FIG. 2, the semiconductor laser device as the first embodiment is operated with the power of 2.2 W in the APC mode at the heatsink temperature of 30° C. As illustrated in FIG. 2, the semiconductor laser device as the first embodiment operates with high stability.

The internal waveguide loss of the semiconductor laser device as the first embodiment is small, i.e., 1 to 2 $cm^{-1}$. That is, no increase in the waveguide loss due to the doping of the optical waveguide layer is detected. In particular, in the construction of FIG. 1, the quantum well active layer 4c is the main cause of the waveguide loss. Namely, light scattering at the boundary between the quantum well active layer 4c and the adjacent optical waveguide layer or the like is considered to be the main cause of the waveguide loss. This situation does not change even when the optical waveguide layers 4a and 4e are doped with impurities of more than $7 \times 10^{17}$ $cm^{-3}$.

As explained above, the loss caused by the quantum well per se is dominant in the net loss in semiconductor laser devices made of similar materials to the semiconductor laser device according to the present invention, and the waveguide loss is not affected by the doping of the optical waveguide layer.

Figure 3:
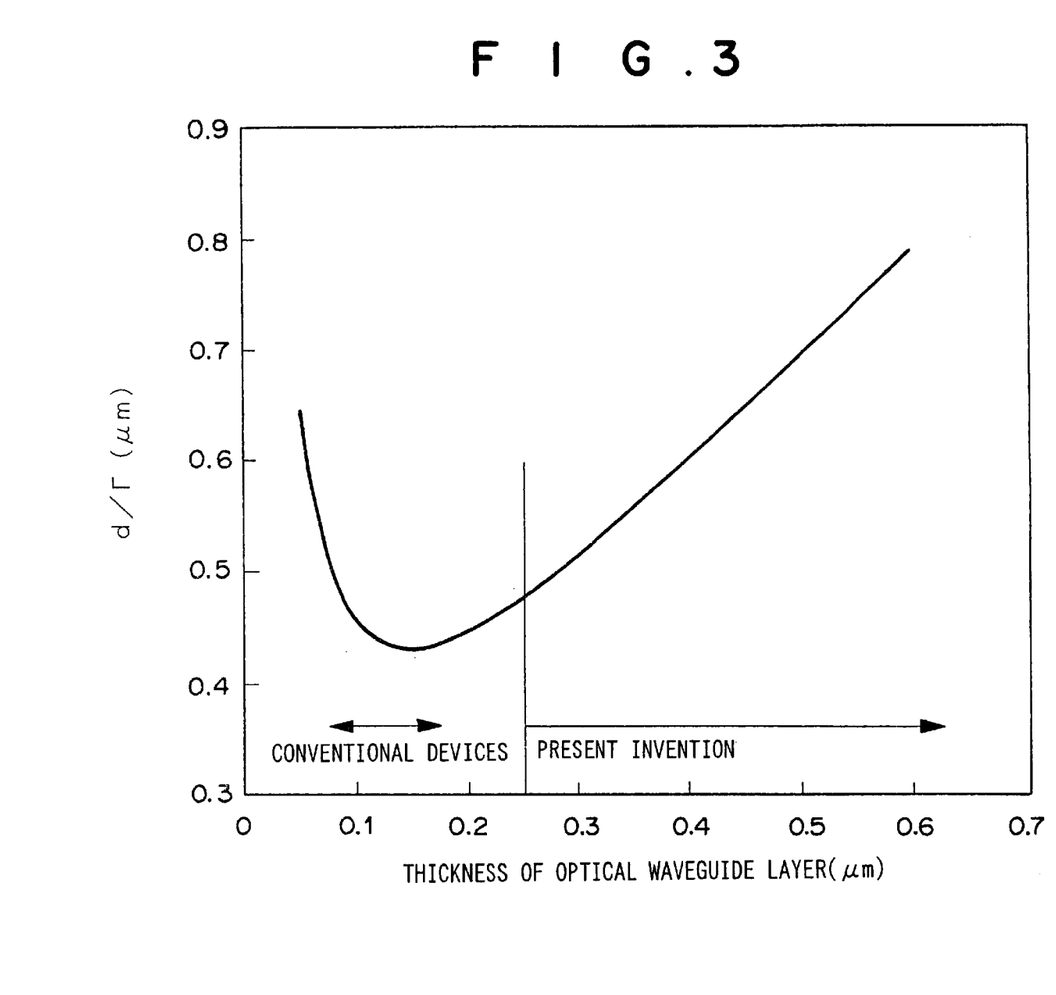
FIG. 3 is a graph indicating dependence of the d/Γ value on the thickness Wg of the optical waveguide layer.

FIG. 3 exhibits dependence of the ratio d/Γ of the thickness d (μm) of the quantum well and the light confinement factor Γ in the SCH active layer 4, on the thickness Wg of the optical waveguide layer, where the d/Γ value is inversely proportional to the optical density in a quantum well. The curve of FIG. 3 is plotted based on the d/Γ values calculated for various values of the thickness Wg (μm) of the optical waveguide layer. As illustrated in FIG. 3, when the thickness Wg of the optical waveguide layer is 0.25 μm or more, the peak optical density decreases due to increase in the size of a light spot.

Figure 4:
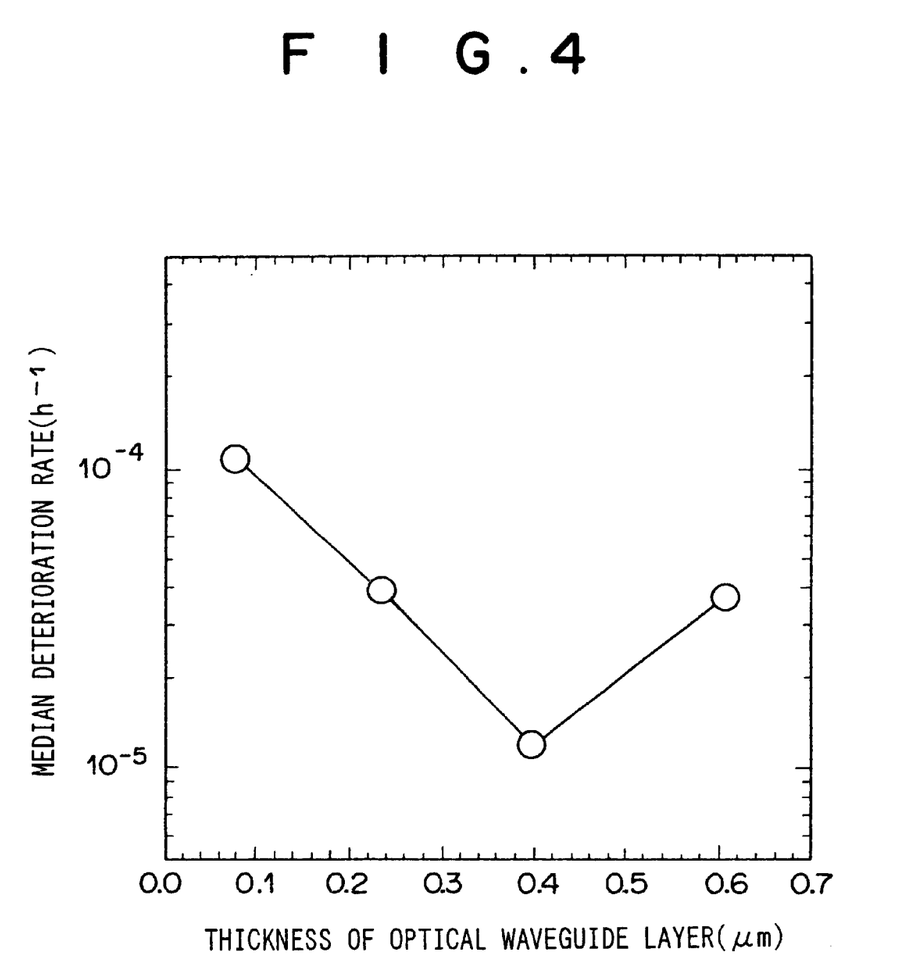
FIG. 4 is a graph indicating dependence on the thickness Wg of the optical waveguide layer, of the rate of increase in the driving current of the ridge waveguide semiconductor laser device in an APC operation.

FIG. 4 is a graph indicating dependence of the rate of increase in the driving current of the ridge waveguide semiconductor laser device in an APC operation, on the thickness Wg of the optical waveguide layer. The curve of FIG. 4 is plotted based on median values of the rate of increase in the driving current which are obtained when the semiconductor laser device is operated with the power of 2.4 W in the APC mode at the heatsink temperature of 30° C. As illustrated in FIG. 4, the rate of increase in the driving current under APC, i.e., the deterioration rate of the semiconductor laser device, decreases when the thickness Wg of the optical waveguide layer is 0.25 μm or more.

As explained above, the deterioration and the internal loss of the semiconductor laser device according to the present invention are caused by the active layer, and greatly depend on the optical power in the active layer, the characteristics of the semiconductor laser device made of similar materials to the semiconductor laser device according to the present invention are greatly improved by making the thickness Wg of the optical waveguide layer 0.25 μm or more.

Figure 5:
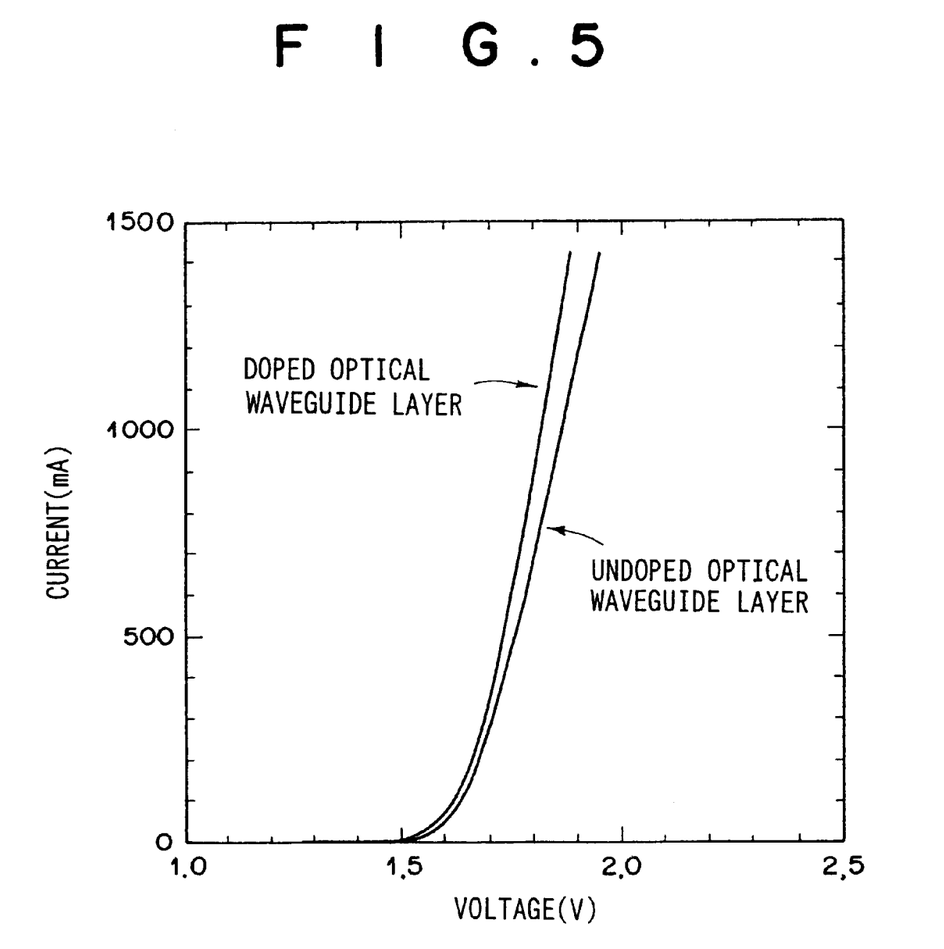
FIG. 5 is a graph indicating a relationship between a driving voltage and a driving current in each of the semiconductor laser device as the first embodiment of the present invention and another semiconductor laser device which has the same construction as semiconductor laser device according to the present invention except that the entire SCH active layer 4 is undoped.

FIG. 5 is a graph indicating a relationship between a driving voltage and a driving current in each of the semiconductor laser device as the first embodiment of the present invention and another semiconductor laser device which has the same construction as the semiconductor laser device except that the entire SCH active layer 4 is undoped. As illustrated in FIG. 5, the driving voltage can be lowered by doping the optical waveguide layer according to the present invention. In addition, the other electro-optic characteristics are not affected by the doping of the optical waveguide layer, and the waveguide loss is maintained low even when the optical waveguide layer is doped according to the present invention. Therefore, the semiconductor laser device according to the present invention is highly efficient.

SECOND EMBODIMENT

Figure 6:
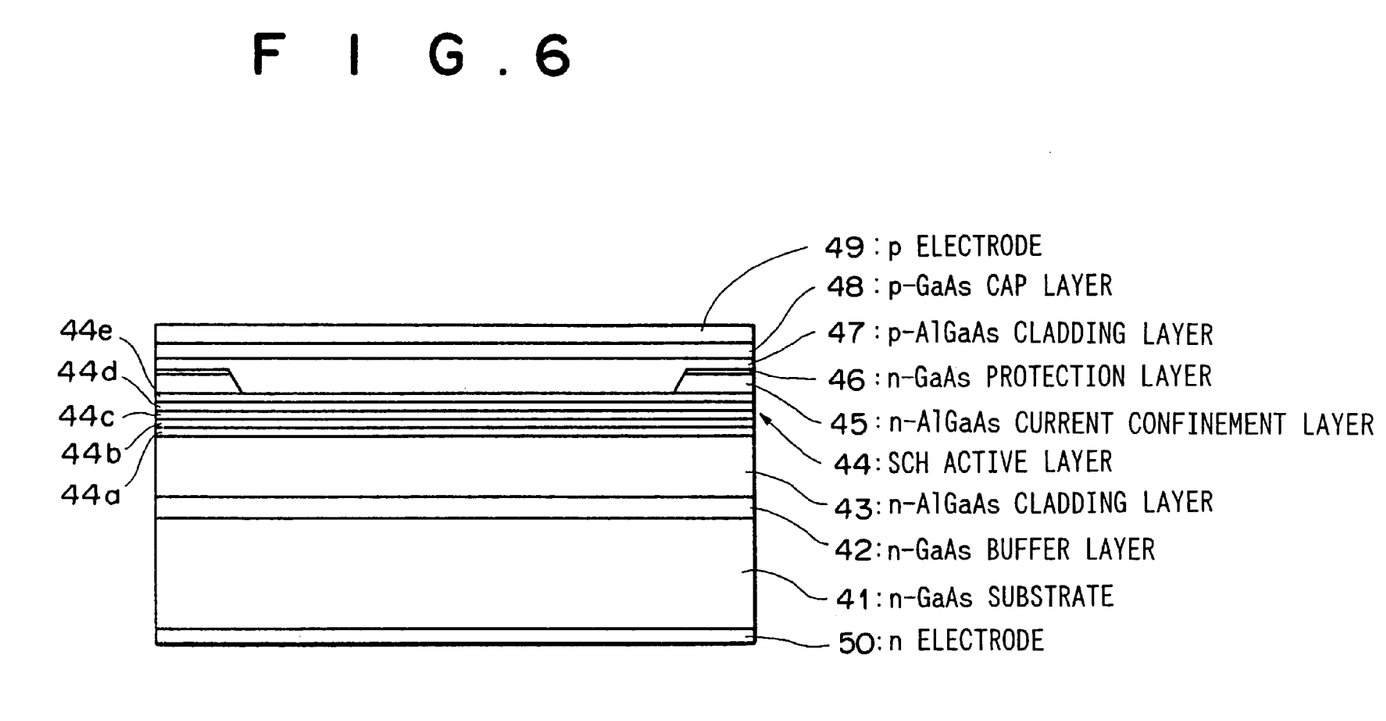
FIG. 6 is a cross-sectional view of a semiconductor laser device as the second embodiment of the present invention.

FIG. 6 is a cross-sectional view of a semiconductor laser device as the second embodiment of the present invention.

As illustrated in FIG. 6, an n-type GaAs buffer layer 42 being doped with $1 \times 10^{18}$ $cm^{-3}$ Si and having a thickness of 0.5 μm, an n-type $Al_{0.55}Ga_{0.45}As$ cladding layer 43 being doped with $1 \times 10^{18}$ $cm^{-3}$ Si and having a thickness of 1 μm, an SCH active layer 44, an n-type $Al_{0.65}Ga_{0.35}As$ current confinement layer 45 being doped with $1 \times 10^{18}$ $cm^{-3}$ Si and having a thickness of 0.8 μm, an n-type GaAs protection layer 46 being doped with $1 \times 10^{18}$ $cm^{-3}$ Si and having a thickness of 0.01 μm, a p-type $Al_{0.55}Ga_{0.45}As$ cladding layer 47 being doped with $1 \times 10^{18}$ $cm^{-3}$ Zn and having a thickness of 1 μm, and a p-type GaAs cap layer 48 being doped with $2 \times 10^{19}$ $cm^{-3}$ Zn and having a thickness of 0.3 μm are formed on an n-type GaAs substrate 41 which is doped with $2 \times 10^{18}$ $cm^{-3}$ Si.

The SCH: active layer 44 is formed of an n-type $In_{0.48}Ga_{0.52}P$ optical waveguide layer 44a being doped with $1 \times 10^{18}$ $cm^{-3}$ Si and having a thickness of 0.20 μm, an undoped $In_{0.48}Ga_{0.52}P$ optical waveguide layer 44b having a thickness of 0.05 $\mu$m, an undoped $In_{0.13}Ga_{0.87}As_{0.75}P_{0.25}$ quantum well layer 44c having a thickness of 10 nm, an undoped $In_{0.48}Ga_{0.52}P$ optical waveguide layer 44d having a thickness of 0.05 $\mu$m, and a p-type $In_{0.48}Ga_{0.52}P$ optical waveguide layer 44e being doped with $1\times10^{18}$ cm$^{-3}$ Zn and having a thickness of 0.20 $\mu$m.

A process for producing the semiconductor laser device of FIG. 6 is explained below.

The semiconductor laser device as the second embodiment of the present invention is produced through two MOCVD stages.

In the first MOCVD stage, the n-type GaAs buffer layer 42, the n-type $Al_{0.55}Ga_{0.45}As$ cladding layer 43, the undoped SCH active layer 44, the n-type $Al_{0.65}Ga_{0.35}As$ current confinement layer 45, and the n-type GaAs protection layer 46 are formed on the n-type GaAs substrate 41 in this order.

Next, a stripe groove having a width of 200 $\mu$m at its bottom is formed by photolithography and chemical etching using a mixed solution of $H_2SO_4:H_2O_2:H_2O=20:1:1$. In this case, the etching stops just above the p-type $In_{0.48}Ga_{0.52}P$ optical waveguide layer 44e, since the SCH active layer 44 is formed of the n-type $In_{0.48}Ga_{0.52}P$ optical waveguide layer 44a, the undoped $In_{0.48}Ga_{0.52}P$ optical waveguide layer 44b, the undoped $In_{0.13}Ga_{0.87}As_{0.75}P_{0.25}$ quantum well active layer 44c, the undoped $In_{0.48}Ga_{0.52}P$ optical waveguide layer 44d, and the p-type $In_{0.48}Ga_{0.52}P$ optical waveguide layer 44e.

In the second MOCVD stage, the p-type $Al_{0.55}Ga_{0.45}As$ cladding layer 47 and the p-type GaAs cap layer 48 are formed in this order.

Thereafter, a p (Ti/Pt/Ti/Pt/Au) electrode 49 is formed, the substrate is polished, an n (AuGe/Ni/Au) electrode 50 is formed, a laser bar is cut out, end surfaces are coated, and discrete laser chips are cut out, in similar ways to the first embodiment. Thus, laser chips as illustrated in FIG. 6 are completed.

THIRD EMBODIMENT

Figure 7:
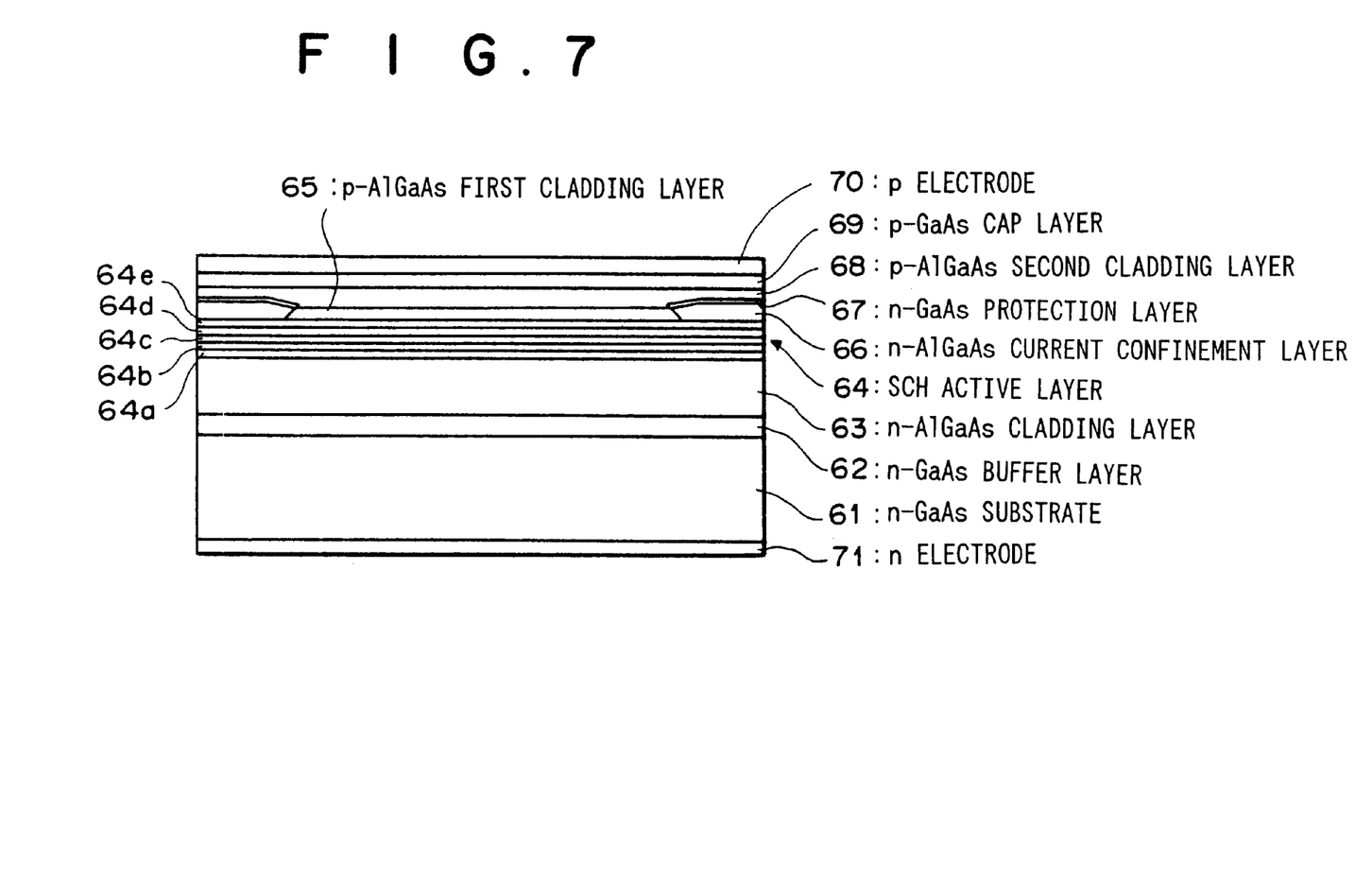
FIG. 7 is a cross-sectional view of a semiconductor laser device as the third embodiment of the present invention.

FIG. 7 is a cross-sectional view of a semiconductor laser device as the third embodiment of the present invention.

As illustrated in FIG. 7, an n-type GaAs buffer layer 62 being doped with $1\times10^{18}$ cm$^{-3}$ Si and having a thickness of 0.5 $\mu$m, an n-type $Al_{0.6}Ga_{0.4}As$ cladding layer 63 being doped with $1\times10^{18}$ cm$^{-3}$ Si and having a thickness of 1 $\mu$m, an undoped SCH active layer 64, an n-type $Al_{0.65}Ga_{0.35}As$ current confinement layer 66 being doped with $1\times10^{18}$ cm$^{-3}$ Si and having a thickness of 0.8 $\mu$m, an n-type GaAs protection layer 67 being doped with $1\times10^{18}$ cm$^{-3}$ Si and having a thickness of 0.1 $\mu$m, a p-type $Al_{0.6}Ga_{0.4}As$ first cladding layer 65 being doped with $1\times10^{18}$ cm$^{-3}$ Zn and having a thickness of 0.9 $\mu$m, a p-type $Al_{0.6}Ga_{0.4}As$ second cladding layer 68 being doped with $1\times10^{18}$ cm$^{-3}$ Zn and having a thickness of 1 $\mu$m, and a p-type GaAs cap layer 69 being doped with $2\times10^{19}$ cm$^{-3}$ Zn and having, a thickness of 0.3 $\mu$m are formed on an n-type GaAs substrate 61 which is doped with $2\times10^{18}$ cm$^{-3}$ Si.

The SCH active layer 64 is formed of an n-type $In_{0.48}Ga_{0.52}P$ optical waveguide layer 64a being doped with $5\times10^{17}$ cm$^{-3}$ Si and having a thickness of 0.50 $\mu$m, an undoped $In_{0.48}Ga_{0.52}P$ optical waveguide layer 64b having a thickness of 0.05 $\mu$m, an undoped $In_{0.3}Ga_{0.87}As_{0.75}P_{0.25}$ quantum well layer 64c having a thickness of 10 nm, an undoped $In_{0.48}Ga_{0.52}P$ optical waveguide layer 64d having a thickness of 0.05 $\mu$m, and a p-type $In_{0.48}Ga_{0.52}P$ optical waveguide layer 64e being doped with $5\times10^{17}$ cm$^{-3}$ Zn and having a thickness of 0.50 $\mu$m.

A process for producing the semiconductor laser device of FIG. 7 is explained below.

The semiconductor laser device as the third embodiment of the present invention is produced through three MOCVD stages.

In the first MOCVD stage, the n-type GaAs buffer layer 62, the n-type $Al_{0.6}Ga_{0.4}As$ cladding layer 63, the SCH active layer 64, the p-type $Al_{0.6}Ga_{0.4}As$ first cladding layer 65, and a p-type GaAs protection layer (not shown) being doped with $1\times10^{18}$ cm$^{-3}$ Zn and having a thickness of 0.01 $\mu$m are formed on the n-type GaAs substrate 61 in this order.

Next, a $SiO_2$ insulation film having a thickness of 0.25 $\mu$m is formed by plasma CVD, and then a $SiO_2$ mask having a stripe shape and a width of 200 $\mu$m is formed by using photolithography and diluted HF. Then, a mesa stripe structure having a width of 200 $\mu$m at its bottom is formed by photolithography and chemical etching using a mixed solution of $H_2SO_4:H_2O_2:H_2O=20:1:1$.

In the second MOCVD stage, the n-type $Al_{0.65}Ga_{0.35}As$ current confinement layer 66 and the n-type GaAs protection layer 67 are formed in this order. Next, short-time etching is performed by using a mixed solution of $H_2SO_4$, $H_2O_2$, and $H_2O$. Then, the $SiO_2$ mask is removed by etching using diluted HF.

Thereafter, the above p-type GaAs protection layer is etched by using a mixed solution of $H_2SO_4$, $H_2O_2$, and $H_2O$ for a short time. Then, in the third MOCVD stage, the p-type $Al_{0.6}Ga_{0.4}As$ second cladding layer 68 and the p-type GaAs cap layer 69 are formed.

Finally, a p (Ti/Pt/Ti/Pt/Au) electrode 70 is formed, the substrate is polished, an n (AuGe/Ni/Au) electrode 71 is formed, a laser bar is cut out, end surfaces are coated, and discrete laser chips are cut out, in similar ways to the first embodiment. Thus, the laser chip as illustrated in FIG. 7 are completed.

Additional Matters (i) Although the semiconductor laser devices as the first to third embodiments are broad-stripe semiconductor laser devices, the present invention can be applied to other broad multiple-transverse-mode semiconductor laser devices, or single-transverse-mode semiconductor laser devices having a stripe width of about 6 $\mu$m or less.

(ii) When the active layer including the quantum well layer and the optical waveguide layers are substantially made of $In_xGa_{1-x}As_yP_{1-y}$ materials ($0 \leq x \leq 1$, $0 \leq y \leq 1$), the active layer may partially include a strained layer which does not lattice-match with the substrate.

(iii) In the first to third embodiments, the thicknesses of the optical waveguide layers which sandwich the quantum well layer are identical. However, the thicknesses of the optical waveguide layers which sandwich the quantum well layer may be different. In this case, the location of the quantum well layer deviates from the position of the maximum optical intensity, to a position in which the light confinement factor $\Gamma$ decreases. Therefore, when the thicker one of the optical waveguide layers has a thickness of 0.25 $\mu$m or more, the optical density in the quantum well layer can be further decreased.

(iv) In addition, all of the contents of Japanese Patent Application No.11(1999)-239119 are incorporated into this specification by reference.

What is claimed is:

1. A semiconductor laser device comprising:
   an active region which is made of an aluminum-free material, and includes a quantum well layer and at least one optical waveguide layer; and a plurality of cladding layers made of at least one AlGaAs or AlGaInP material, wherein at least one of said cladding layers is positioned above said active region and at least one other of said cladding layers is positioned below said active region;

wherein a portion of said at least one optical waveguide layer located on one side of said quantum well layer has a thickness of 0.25 μm or more, and said at least one optical waveguide layer, other than said portion of the at least one optical waveguide layer, has a thickness of at least 10 nm and is doped with impurity of $10^{17}$ cm$^{-3}$ or more, and wherein said laser device is of an index-guided structure.

2. A semiconductor laser device according to claim 1, wherein predetermined areas of at least one of said plurality of cladding layers, above a boundary between said at least one of said plurality of cladding layers and one of said at least one optical waveguide layer located below the at least one of said plurality of cladding layers, are selectively removed so as to form a stripe structure.

3. A semiconductor laser device according to claim 1, wherein said aluminum-free material has a composition of $In_xGa_{1-x}As_yP_{1-y}$ (0≦x≦1, 0≦y≦1).

4. A semiconductor laser device according to claim 2, wherein said aluminum-free material has a composition of $In_xGa_{1-x}As_yP_{1-y}$ (0≦x≦1, 0≦y≦1).

5. A semiconductor laser device according to claim 1, wherein the thickness of an upper cladding layer is 1 μm or less.

6. A semiconductor laser device according to claim 2, wherein the thickness of an upper cladding layer is 1 μm or less.

* * * * *